United States Patent [19]

Furuyama

[11] Patent Number: 4,472,643
[45] Date of Patent: Sep. 18, 1984

[54] DYNAMIC SIGNAL GENERATION CIRCUIT

[75] Inventor: Toru Furuyama, Tokyo, Japan

[73] Assignee: Tokyo Shibaura Denki Kabushiki Kaisha, Kawasaki, Japan

[21] Appl. No.: 304,592

[22] Filed: Sep. 22, 1981

[30] Foreign Application Priority Data

Sep. 26, 1980 [JP] Japan .................................. 55-134090
Sep. 26, 1980 [JP] Japan .................................. 55-134091

[51] Int. Cl.³ ........................ H03K 5/13; H03K 17/10; H03K 17/284; H03K 17/693
[52] U.S. Cl. .................................... 307/269; 307/578; 307/581; 307/583; 307/605
[58] Field of Search ............... 307/262, 269, 450, 453, 307/482, 581, 577–578, 582–583, 601, 605; 377/79, 105

[56] References Cited

U.S. PATENT DOCUMENTS

| | | | |
|---|---|---|---|
| 3,771,145 | 11/1973 | Wiener | 307/453 X |
| 3,906,464 | 9/1975 | Lattin | 307/269 X |
| 4,061,933 | 12/1977 | Schroeder et al. | 307/269 X |
| 4,071,783 | 1/1978 | Knepper | 307/482 X |
| 4,190,897 | 2/1980 | Someshwar | 307/269 X |
| 4,317,051 | 2/1982 | Young, Jr. | 307/578 X |
| 4,352,996 | 10/1982 | White, Jr. | 307/578 X |
| 4,388,538 | 6/1983 | Ikeda | 307/482 |

OTHER PUBLICATIONS

Pashley et al., "A 16K×1b static RAM", 1979 IEEE Int'l., Solid-State Circuits Conf. Digest of Technical Papers, 106, (Feb. 15, 1979).

*Primary Examiner*—Larry N. Anagnos
*Attorney, Agent, or Firm*—Finnegan, Henderson, Farabow, Garrett & Dunner

[57] ABSTRACT

A dynamic signal generation circuit comprising a semiconductor circuit for receiving two input clock signals $\phi$ and $\overline{\phi}$ out of phase with each other and providing a first output signal $\phi 1$, said first output signal $\phi 1$ rising in synchronism to the leading edge of said input clock signal $\phi$, assuming a floating state after the lapse of a predetermined period of time falling in synchronism to the trailing edge of said input clock signal $\phi$, and a second output signal $\phi 2$, said second output signal $\phi 2$ falling in synchronism to the occurrence of the floating state of said input signal $\phi 1$ and rising in synchronism to the trailing edge of said input clock signal $\phi$, a transistor circuit including a first and a second enhancement type transistor cascade connected between a $V_{DD}$ and a $V_{SS}$ power supply terminal, said first output signal $\phi 1$ from said semiconductor circuit being impressed upon the gate of said first enhancement type transistor, said second output signal $\phi 2$ from said semiconductor circuit being impressed upon the gate of said second enhancement type transistor, a capacitor circuit connected between the gate of said first transistor and the node between said first and second transistors, and a depletion type transistor connected between said $V_{DD}$ power supply terminal and said $V_{SS}$ power supply terminal, the gate of the depletion type transistor being connected to a point at a potential substantially same as the potential on said node between said first and second transistors.

9 Claims, 18 Drawing Figures

FIG. 1
PRIOR ART
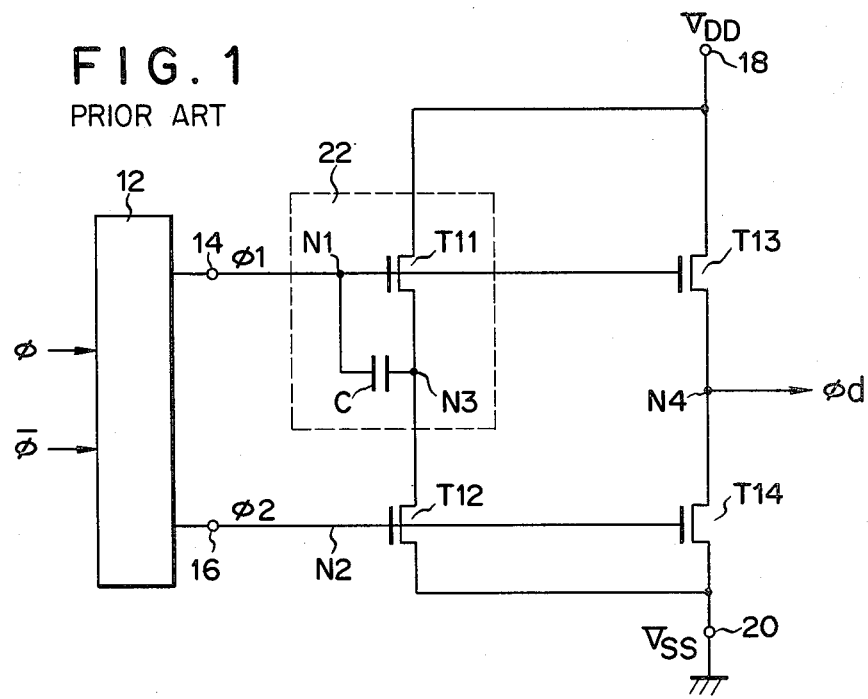
FIG. 2A $\phi$
FIG. 2B $\bar{\phi}$
FIG. 2C $\phi1$
FIG. 2D $\phi2$
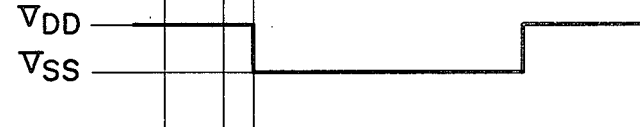
FIG. 2E $\phi d$
PRIOR ART

DYNAMIC SIGNAL GENERATION CIRCUIT

BACKGROUND OF THE INVENTION

This invention relates to dynamic signal generation circuits used for MOS integrated circuits and the like for generating a delayed clock signal by raising the voltage of an input clock signal through a capacitor-coupled bootstrap circuit.

The N-channel MOS (Metal Oxide Semiconductor) integrated circuit generally makes effective use of a dynamic signal generation circuit, which includes a load transistor and a drive transistor both being of the enhancement type, in order to reduce power consumption. In such a dynamic signal generation circuit, a capacitor-coupled circuit (or bootstrap circuit) for raising the input signal voltage is connected to a necessary node (circuit junction) for making up the signal amplitude attenuation that naturally results from the use of the enhancement type load transistor and corresponds in amount to the threshold voltage component.

A typical dynamic signal generation circuit of this sort which is extensively used for such integrated circuits is a MOS RAM (Random Access Memory) has a construction as shown in FIG. 1. Reference numeral 12 designates a semiconductor circuit, which receives input clock signals $\phi$ and $\bar{\phi}$ (FIGS. 2A and 2B) and provides output signals $\phi 1$ and $\phi 2$, which will be described later, from its first and second output terminals 14 and 16 respectively. This semiconductor circuit includes a plurality of N-channel enhancement transistors. The dynamic signal generation circuit also comprises N-channel enhancement transistors T11, T12, T13 and T14, a power supply terminal 18 which is connected to a first power supply source at a potential $V_{DD}$, and another power supply terminal 20 connected to a second power source at a potential $V_{SS}$. The first output terminal 14 of the semiconductor circuit 12 is connected to the gate of the transistors T11 and T13 and also connected to one end of a capacitor C (this junction being hereinafter referred to as node N1). The transistors T11 and T13 have their drain connected to the $V_{DD}$ power supply terminal 18. The transistor T11 has its source connected to the other end of the capacitor and also to the drain of the transistor T12 (this junction being hereinafter referred to as node N3).

The second output terminal 16 is connected to the gate of the transistor T13 (this junction being hereinafter referred to as node N2), and is also connected to the gate of the transistor T14. The transistors T12 and T14 have their sources connected to the $V_{SS}$ power source terminal 20. The transistor T14 has its drain connected to the source of the transistor T13 (this junction being hereinafter referred to as node N4). An output signal $\phi d$ is provided from this node N4. Enclosed within a dashed rectangle is a bootstrap circuit 22.

The output signal $\phi 1$ of the semiconductor circuit 12, as shown in FIG. 2C, rises to the potential $V_{DD}$ in synchronism to the rising of the input clock signal $\phi$ shown in FIG. 2A (or in synchronism to the falling of the input clock signal $\bar{\phi}$ as shown in FIG. 2B). After the lapse of a delay time in the operation of the semiconductor circuit 12, the output signal assumes a floating state having a high potential level $V_P$ (which is equal to $V_{DD}+V_{TE}$, $V_{TE}$ being the threshold value of each transistor), and it falls to a low potential level $V_{SS}$ in synchronism to the falling of the input clock signal $\phi$ or in synchronism to the rising of the input clock signal $\bar{\phi}$. The output signal $\phi 2$ (FIG. 2D), on the other hand, falls to the potential level $V_{SS}$ in synchronism to the rising of the output signal $\phi 1$ to the potential level $V_P=(V_{DD}+V_{TE})$ and rises to the potential level $V_{DD}$ in synchronism to the falling of the input clock signal $\phi$ or rising of the input clock signal $\bar{\phi}$.

The dynamic signal generation circuit of FIG. 1 described above operates as follows.

In the stand-by state, i.e., at an instant $t_s$, the node N1 is at the low potential, the node N2 is at the high potential, and the nodes N3 and N4 are at the low potential. With the rising of the input clock signal $\phi 1$, the node N1 commences to be charged. At this time, the node N2 remains at the high potential $V_{DD}$. When the charging mentioned above has proceeded to a certain extent or is completed, the input clock signal $\phi 2$ falls to discharge the node N2. Assuming for the sake of simplicity that the threshold voltages of the individual transistors T11 to T14 are all equal (and lower than $V_{TE}$, with $0 < V_{TE} < V_{DD}$), the transistors T11 to T14 are all "on" from the instant when the potential on the node N1 being charged exceeds $V_{TE}$ till the instant when the potential on the node N2 being discharged becomes lower than $V_{TE}$. During this period, feedthrough current flows from the $V_{DD}$ power supply terminal 18 through the transistors T11 and T12 to the $V_{SS}$ power supply terminal 20, and also flows from the $V_{DD}$ power supply terminal through the transistors T13 and T14 to the $V_{SS}$ power supply terminal 20. Also, during this time, the node N3 is held at a low potential (referred to as potential $V_L$) which is determined by the conductance ratio between the transistors T11 and T12.

The discharge of the node N2 is caused when a certain voltage difference is developed between the nodes N1 and N2, i.e., across the capacitor C. With the discharging of the node N2, the transistors T12 and T14 are turned off to cause charging of the node N3 from the potential $V_L$ to the high potential. As a result, the output terminal 14 of the semiconductor circuit 12, from which the output signal $\phi 1$ is provided, assumes a high impedance state, that is, the node N1 assumes a floating state. The potential on the node N1 is thus raised from the potential $V_{DD}$ to the high potential $V_P$ due to the capacitance coupling of the nodes N1 and N3 by the intermediate capacitor C. The potential $V_P$ is desirably higher than $V_{DD}+V_{TE}$. If this condition is satisfied, the node N4 is also charged up to the potential $V_{DD}$. Consequently, the output signal $\phi d$, shown in FIG. 2E, which is delayed behind the input clock signal $\phi$ to the semiconductor circuit 12, is obtained from the node N4. The falling of the input clock signal $\phi$ causes the node N1 to return to the low potential and the node N2 to the high potential. As a result, both the nodes N3 and N4 are discharged to recover the initial state.

In the dynamic generation circuit of the prior art as described above, however, the feedthrough current from the instant when the node N1 begins to be charged till the instant when the node N2 begins to be discharged is high and not ignorable from the standpoint of power consumption and source voltage fluctuations. Particularly, the feedthrough current through the transistors T13 and T14, which must have high conductance for charging and discharging the node N4 which is connected to a high capacitance load is higher than the feedthrough current through the transistors T11 and T12 and presents problems in regard of power consumption and influence on source voltage fluctuations.

Therefore, the feedthrough current, and hence the effects on source voltage fluctuations, is desirably reduced.

SUMMARY OF THE INVENTION

This invention is intended to overcome the problems noted above, and its object is to provide a dynamic signal generation circuit which can reduce the feedthrough current through the transistor circuit to reduce power consumption and minimize the effects upon source voltage fluctuations.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

According to the invention, there is provided a dynamic signal generation circuit, which comprises a semiconductor circuit for receiving two input clock signals $\phi$ and $\bar{\phi}$ out of phase with each other and providing a first output signal $\phi 1$, said first output signal $\phi 1$ rising in synchronism to the leading edge of said input clock signal $\phi$, assuming a floating state after the lapse of a predetermined period of time and falling in synchronism to the trailing edge of said input clock signal $\phi$, and a second output signal $\phi 2$, said second output signal falling in synchronism to the accurence of floating signal of said input signal $\phi 1$ and rising in synchronism to the trailing edge of said input clock signal $\phi$, first and second power supply terminals a first transistor circuit including first and second enhancement type transistor's cascode connected between said first and second power supply terminal's, said first output signal $\phi 1$ from said semiconductor circuit being impressed upon the gate of said first enhancement type transistor, said second output signal $\phi 2$ from said semiconductor being impressed upon the gate of said second enhancement transistor, a capacitor circuit connected between the gate of said first transistor and the node between said first and second transistors, a second transistor circuit including third and fourth enhancement type transistors cascode connected between said first and said second power supply terminals, said first output signal $\phi 1$ being impressed upon the gate of said third enhancement type transistor, said second output signal $\phi 2$ being impressed upon the gate of said fourth enhancement type transistor, and a first depletion type transistor connected in the current path of said second transistor circuit, the conduction channel of the first depletion type transistor extending along said current path of said second transistor circuit, and the gate of the first depletion type transistor being connected to a potential substantially the same as the potential on said node between the first and second enhancement type transistors.

BRIEF DESCRIPTION OF THE DRAWINGS

FIG. 1 is a circuit diagram showing a prior art dynamic signal generation circuit;

FIGS. 2A through 2E form a timing chart useful to explain the operation of the circuit shown in FIG. 1;

DETAILED DESCRIPTION OF THE PREFERRED EMBODIMENTS

Preferred embodiments of the invention will now be described with reference to the accompanying drawings.

Figure 3:
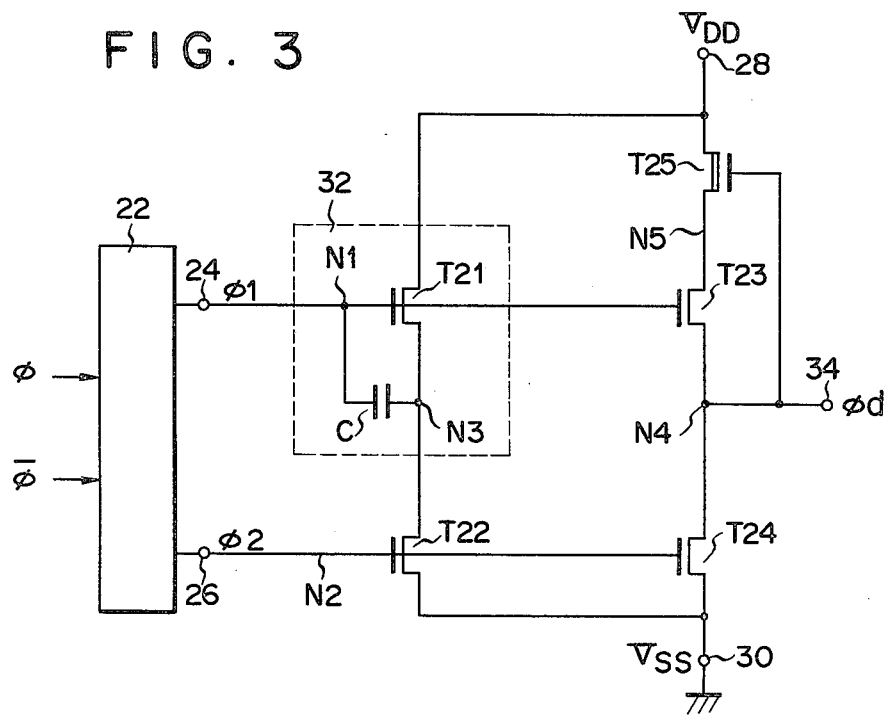
FIG. 3 is a circuit diagram showing an embodiment of the dynamic signal generation circuit according to the invention.
Figure 4A:
FIGS. 4A through 4E form a timing chart useful to explain the operation of the circuit shown in FIG. 3.
Figure 4B:

FIG. 3 shows a first embodiment of the invention. A semiconductor circuit 22 has the same constructions as the semiconductor circuit 12 shown in FIG. 1. Circuit 22 receives two input clock signals $\phi$ and $\bar{\phi}$, 180° output of phase with each other (FIGS. 4A and 4B), and provides output signals $\phi 1$ and $\phi 2$ (FIGS. 4C and 4D) at respective output terminals 24 and 26. Transistors T21, T22, T23 and T24 are N-channel enhancement transistors (hereinafter referred to as E-type transistors or merely transistors). A further transistor T25 is provided, which is a depletion type transistor (hereinafter referred to as D-type transistor or merely transistor).

The source of the E-type transistor T21 and the drain of the E-type transistor T22 are connected to each other, that is, the transistors T21 and T22 are connected in cascode (this junction being hereinafter referred to as node N3). The drain of the transistor T21 is connected to a $V_{DD}$ power supply terminal 28, which is held at a potential $V_{DD}$. The source of the transistor T22 is connected to a $V_{SS}$ power supply terminal 30, which is held at a potential $V_{SS}$. The gates of the transistors T21 and T22 are connected to the respective first and second output terminals 24 and 26 of the semiconductor circuit 22, and the first and second output signals $\phi 1$ and $\phi 2$ are respectively coupled to these gates. The junction between the first output terminal 24 and the gate of the transistor T21 is hereinafter referred to as node N1. Also, the junction between the second output terminal 26 and the gate of the transistor T22 is hereinafter referred to as node N2. A capacitor C is connected between the node N1 (i.e., the gate of the transistor T21) and the node N3, forming a bootstrap circuit 32 with capacitor coupling by capacitor C to transistor T21.

The source of the E-type transistor T23 and the drain of the E-type transistor T24 are connected to each other, that is, the transistors T23 and T24 are connected in cascode, this junction being hereinafter referred to as node N4. The drain of the transistor T23 and the source of the D-type transistor T25 are connected to each other, and the drain of the transistor T25 is connected to the $V_{DD}$ power supply terminal 28, the junction between the source of the transistor T25 and the drain of the transistor T23 being hereinafter referred to as node N5. The source of the transistor T24 is connected to a $V_{SS}$ power supply terminal 30. The gate of the D-type transistor T25 is connected to the node N4. The node N4 is connected to an output terninal 34 of the dynamic signal generation circuit.

The operation of the dynamic signal generation circuit according to the invention shown in FIG. 3 will now be described.

In its stand-by state, i.e., at an instant $t_s$ (FIGS. 4A through 4E), the node N1 is at a low potential, node N2 is at a high potential, and nodes N3 and N4 are both at a low potential. Denoting the threshold voltage of the D-type transistor T25 by $V_{TD}$ ($0 > V_{TD} > -V_{DD}$), the potential at the node N5 at this time is $V_{ND}$ (where $-V_{TD} \leq V_{ND} \leq V_{DD}$). In synchronism to the rising of the input clock signal $\phi$, the output signal $\phi1$ rises to cause charging of the node N1. In the initial state of this charging, the node N2 remains at the high potential. When the charging has proceeded to a certain extent or is completed, the output signal $\phi2$ falls to cause discharge of the node N2.

Denoting the threshold voltage of each of the E-type transistors T21 to T24 by $V_{TE}$ for the sake of simplicity, the transistors T21 to T24 are all "on" during the period from the instant when the potential on the node N1 exceeds the threshold voltage $V_{TE}$ till the instant when the potential on the node N2 becomes lower than the threshold voltage $V_{TE}$. In this state, the node N3 is held at a low potential $V_{L1}$ which is determined by the conductance ratio between the transistors T21 and T22, and also the node N4 is held at a low potential $V_{L2}$ which is determined by the conductance ratio between the D-type transistor T25 and the E-type transistors T23 and T24. Further, the potential on the node N5 is $V_{DD}-V_{TD}$.

When a certain potential difference is built up between the nodes N1 and N3, i.e., across the capacitor C, the node N2 is discharged to turn off the E-type transistors T22 and T24 so as to cause charging of the node N3 from the low potential $V_{L1}$ to a high potential. At this time, the potential on the node N1 is raised from the potential $V_{DD}$ up to the high potential $V_P$ due to the capacitor-coupling of the nodes N1 and N3 by the capacitor C. The voltage is preferably higher than $V_{DD}+V_{TE}$. In synchronism to the rising of the potential at the node N1, the potential of the output signal $\phi d$ (FIG. 4E) at the output terminal of the dynamic signal generation circuit rises. Thereafter, the potential on the node N1 is returned to the low potential and the potential on the node N2 to the high potential in synchronism to the falling of the input signal. As a result, the nodes N3 and N4 are both discharged to recover the initial state with the node N5 at a potential $V_{ND}$ ($-V_{TD} \leq V_{ND} \leq V_{DD}$).

In the above operation, the output signal $\phi d$, the rising of which is delayed by $t_d$ behind the rising of the input clock signal is generated from the output terminal 34. The potential $V_{ND}$ on the node N5 at the time when the circuit returns to the initial state, assumes a value between $-V_{TD}$ and $V_{DD}$ depending upon the relation between the timing of change of the potential at the node N1 to the low potential and the timing of change of the potential at the node N2 to the high potential.

While in the prior art circuit of FIG. 1 the potential $V_{DD}$ is impressed upon the drain of the transistor T13, in the embodiment of FIG. 3 the potential at the node N5 is impressed upon the drain of the transistor T23. The potential on the node N5 is no higher than $V_{L2}-V_{TD}$ in the presence of the feedthrough current. Thus, the feedthrough current through the transistors T25, T23, and T24 in the state where the transistors T21 to T25 are all "on", may be held lower than the feedthrough current through the transistors T13 and T14 in the prior art circuit. In addition, since the feedthrough current through the transistors T13 and T14 is higher than the feedthrough current through the transistors T11 and T12 as has been described earlier in connection with the prior art circuit of FIG. 1, the technique of suppressing the feedthrough current corresponding to that through the transistors T13 and T14 in the circuit of FIG. 1, i.e., the feedthrough current through the transistors T23 and T24 in the embodiment of FIG. 3, is particularly effective for reducing power consumption and suppressing power source fluctuations. Further, the state in which the transistors T21 to T24 are all "on" is not a continuous state but a transient state. Thus, as described in this embodiment, lowering the drain potential of the transistor T23 enhances to promote the reduction of power consumption and suppression of power source fluctuations. The voltage $V_{TD}$ is desirably $0 > V_{TD} > -V_{DD}$; for example, when the voltage $V_{DD}$ is 5 V, $V_{TD}$ is preferably 0.2 to 0.3 V.

Figure 5:
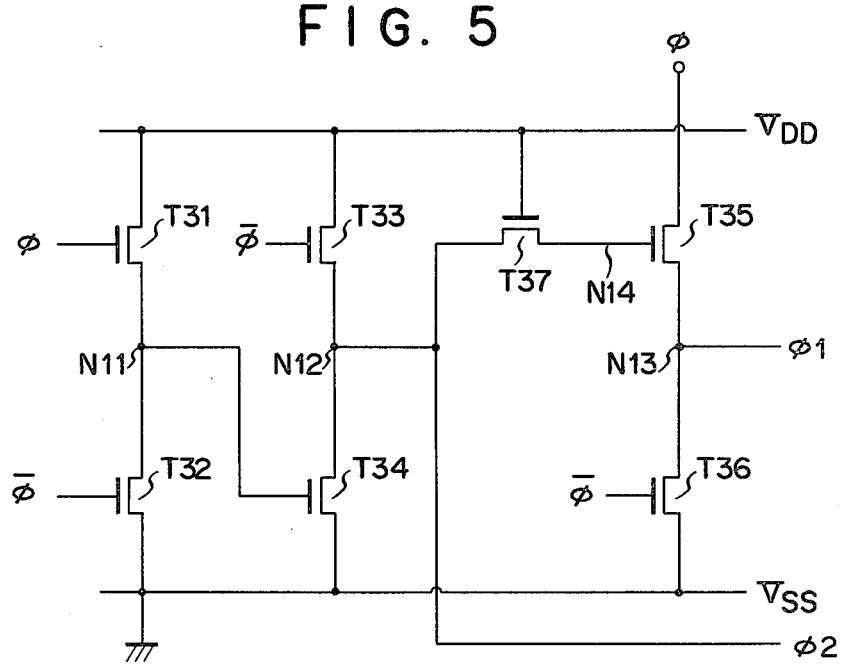
FIG. 5 is a circuit diagram showing a semiconductor circuit assembled in the circuit shown in FIG. 3.

FIG. 5 shows an example of the semiconductor circuit 22. This circuit includes transistors T31 to T37 which are all of the N-channel enhancement type. The transistors T31 and T32, the transistors T33 and T34 and the transistors T35 and T36 are connected as respective cascade connection pairs between terminals at potentials $V_{DD}$ and $V_{SS}$. The node N11 between the transistors T31 and T32 is connected to the gate of the transistor T34, and the node N12 between the transistors T33 and T34 is connected to the drain of the transistor T37. The transistor T37 has its gate connected to the $V_{DD}$ potential terminal and its source connected to the gate of the transistor T35. The output signal $\phi1$ is provided from the node N13 between the transistors T35 and T36. The output signal $\phi2$ is provided at node N12. The input clock signal $\phi$ is coupled to the gate of the transistor T31, while the input clock signal $\overline{\phi}$ is coupled to the gate of the transistors T32 and T36. The input clock signal $\phi$ is also coupled to the drain of the transistor T35. The junction between the drain of the transistor T37 and the gate of the transistor T35 is referred to as a node N14.

In operation, in synchronism to the change of the input clock signals $\phi$ and $\overline{\phi}$ to the respective high and low levels (FIGS. 4A and 4B), i.e., with the change of the potential on the gate of the transistor T36 to low level, the potential on the node N13 is changed to high level. Thus, in synchronism to the change of the signals $\phi$ and $\overline{\phi}$ the potential of the output signal $\phi1$ (FIG. 4C) rises to $V_{DD}$. Also, with this change of the signals $\phi$ and $\overline{\phi}$, the transistor T31 is turned on while the transistor T32 is turned off, thus changing the potential on the node N11 to the high level to turn on the transistor T34 and turn off the transistor T33. As a result, the potential on the node N12 is changed to the low level, and this low level ($V_{SS}$) is provided as the output signal $\phi2$ (FIG. 4D). It is to be understood that the change of the signal $\phi2$ to the low level occurs after the lapse of a delay time $t_d$, which is required for the action of the transistors T31 to T34, from the instant of change of the signals $\phi$ and $\overline{\phi}$ mentioned above. In synchronism to the change of the signal $\phi2$ to the low level, the potential of the node N14 i.e. the gate of the transistor T35 is changed to low level to turn off the transistor T35, rendering the output signal $\phi1$ at the node N13 in high impedance. Therefore, when the bootstrap circuit 32 in FIG. 3 operates, the potential of the node N1 rises and the output signal $\phi1$ raises to a potential $V_{DD}+V_{TE} \leq V_P$. In synchronism to the subsequent falling of signal $\phi$ and rising of signal $\overline{\phi}$, the output signals $\phi1$ and $\phi2$ respectively fall and rise to their initial potentials.

Figure 4C:
Figure 4D:
Figure 4E:
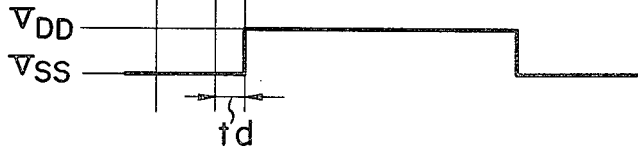

In the above operation, the output signals $\phi1$ and $\phi2$ as shown in FIGS. 4C and 4D respectively are obtained.

Figure 6:
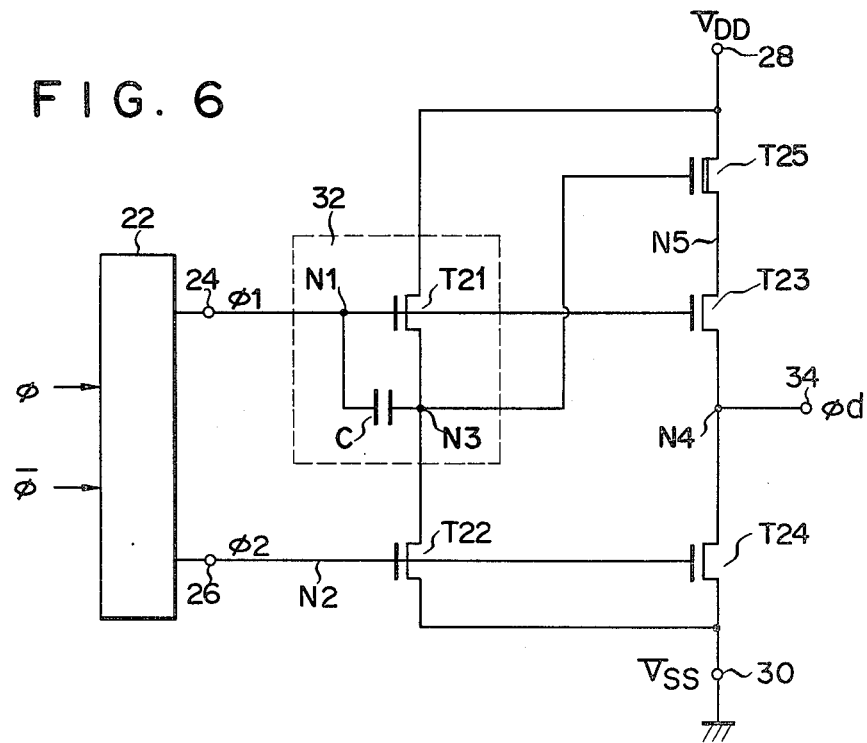
FIGS. 6 to 10 are circuit diagrams showing different embodiments of the invention.

FIG. 6 shows a different embodiment of the invention. This embodiment is the same as the preceding embodiment of FIG. 3 except that the gate of the D-type transistor T25 is connected not to the node N4 but to the node N3, and like parts are designated by like reference numerals. Only the different aspect will be described.

With this embodiment, with the gate of the transistor T25 connected to the node N3, denoting the potential on the node N3 by $V_{L1}$ and the potential on the node N4 by $V_{L2}$ in the presence of feedthrough current through the D-type transistor T25 and E-type transistors T23 and T24, the potential on the node N5 may be as low as $V_{L1}-V_{TD}$ at the most. Thus, the same effects as have been described in connection with the preceding embodiment of FIG. 3 are obtained.

Figure 7:
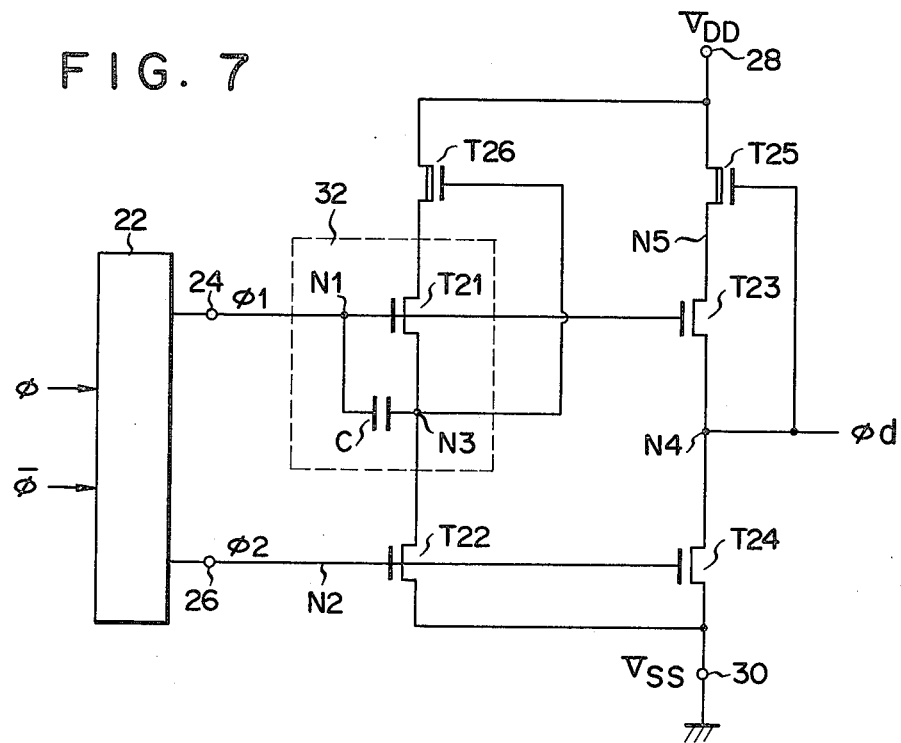
Figure 8:
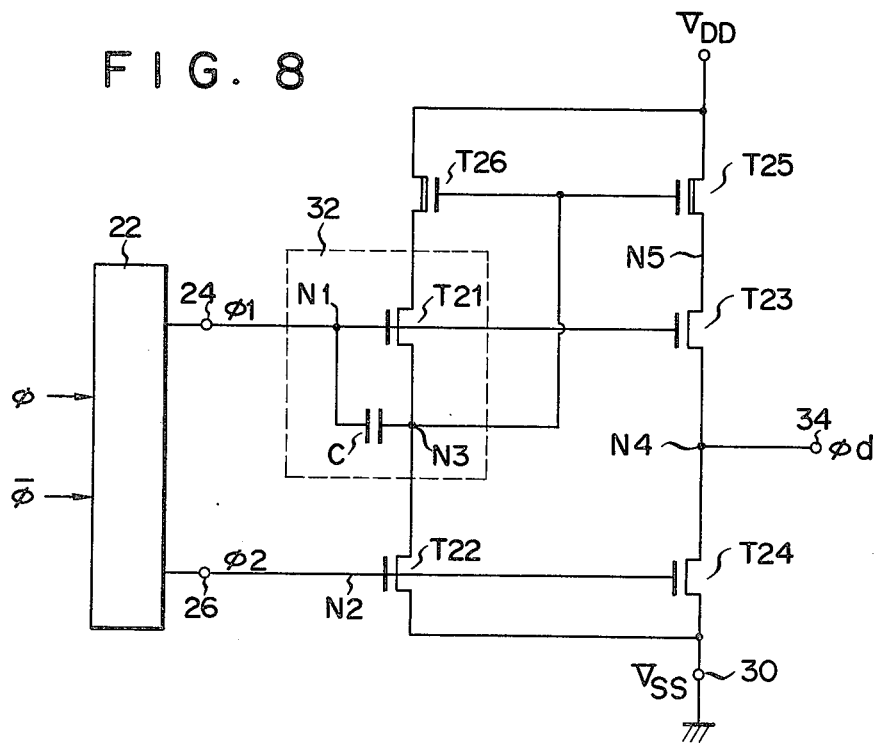
Figure 9:
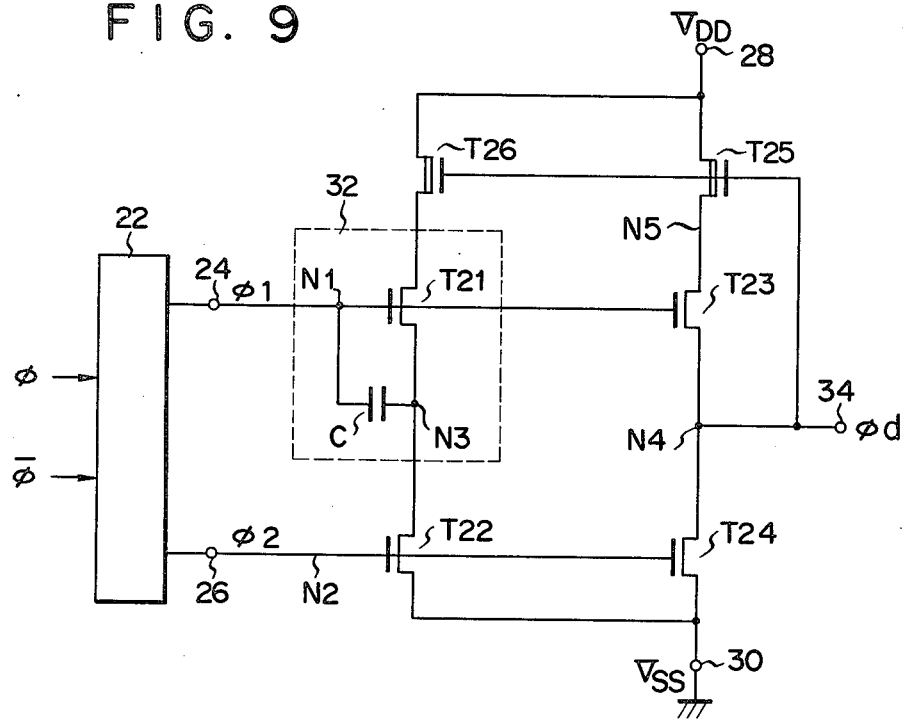

FIGS. 7 to 9 show further embodiments of the invention. These embodiments are basically set apart from the previous embodiments of FIGS. 3 and 6 in that a depletion type transistor T26 (with its threshold voltage $V_{TD}$ being $0 > V_{TD} > -V_{DD}$) is provided between the $V_{DD}$ power supply terminal 28 and E-type transistor T21. Like parts in these embodiments corresponding to those in the embodiments of FIGS. 3 and 6 are designated by like reference numerals and are not described any further.

In the embodiment of FIG. 7, the gate of the D-type transistor T26 is connected to the node N3, and the gate of the D-type transistor T25 is connected to the node N4.

In the embodiment of FIG. 8, the gates of the D-type transistors T25 and T26 are commonly connected to the node N3.

In the embodiment of FIG. 9, the gates of the D-type transistors T25 and T26 are commonly connected to the node N4.

The operation of the embodiments of FIGS. 7, 8 and 9 is basically the same as and will be readily understood from the description of operation of the embodiment of FIG. 3, and will not be described. The same effects as with the embodiment of FIG. 3 can be obtained with these embodiments. In addition, with these embodiments the feedthrough current through the D-type transistor T26 and E-type transistors T21 and T22 can also be reduced.

Figure 10:
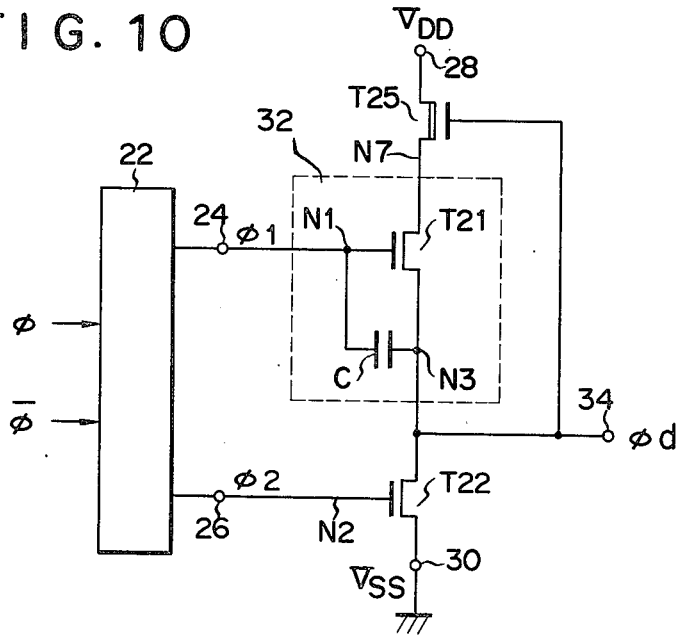

FIG. 10 shows a further embodiment of the invention. This embodiment permits reduction of the number of component elements and improvement of the integration density as well as obtaining the same effects as described earlier in connection with the preceding embodiments of FIGS. 3 and 6 to 9.

In the preceding embodiments, it has been necessary to develop a high potential difference between the nodes N1 and N3 at the instant when causing the discharge of the node N2 for raising the potential at the node N1 up to the potential Vp. To this end, it is necessary to set the conductance of the transistor T21 sufficiently low compared to the conductance of the transistor T22, for instance about 1:4. That is, it is necessary to set the ratio of the channel length divided by channel width (W/L) between the transistors T21 and T22 to, for instance, 1:4. This makes impossible to obtain from node N3 an output signal $\phi d$ that can be used for charging and discharging a large load capacitor. Accordingly, the transistors T23 and T24 having a high conductance have been provided to obtain the output signal $\phi d$ capable of charging and discharging a high capacitance load from the node N4.

The embodiment of FIG. 10 is set apart from, for instance, the embodiment of FIG. 3 in that the E-type transistors T23 and T24 are omitted and that the D-type transistor T25 is connected between the $V_{DD}$ power supply terminal 28 and the drain of the E-type transistor T21. Like parts in this embodiment are again designated by like reference numerals where they correspond to like parts in the preceding embodiments, and are not described.

In operation, in the stand-by state, i.e., at the instant $t_s$ (FIGS. 4A through 4E), the node N1 is at low potential, node N2 is at high potential, node N7 is at a potential $V_{ND} (-V_{TD} \leq V_{ND} \leq V_{DD})$, and node N3 is at a low potential. The potential $V_{ND}$ is determined within the range of $-V_{TD} \leq V_{ND} \leq V_{DD}$ by the relation between the timing of the change of the potential on the node N1 to the low voltage and the timing of the change of the potential of the node N2 to the high potential at the time of the transition of the circuit to the stand-by state. With the rising of the output signal $\phi 1$ (FIG. 4C) in synchronism to the rising of the input clock signal (FIG. 4A), the node N1 starts to be charged. At this time, the node N2 is held at the high potential.

When the charging has proceeded to an extent at which the potential on the node N1 exceeds $V_{TE}$, the transistor T21 is turned on to cause feedthrough current from the $V_{DD}$ power supply terminal through the transistors T25, T21 and T22 to the $V_{SS}$ power supply terminal. The potentials on the nodes N7 and N3 are changed according to the potential on the node N1. The potential $V_L$ on the node N3 in this state is lower than the potential $V_L-V_{TD}$ on the node N7. As an example, where the transistors T25, T21 and T22 have an equal ratio W/L between the width W and length L of the channel region, the potentials on the nodes N1 and N2 are 5 V, $V_{TD} = -2$ V and $V_{TE} = 1$ V, the calculated values of the potentials on the nodes N7 and N3 are respectively about 0.71 V and about 0.35 V. Thus, in this embodiment, a sufficiently high potential difference can be obtained between the nodes N1 and N3 prior to the discharge of the node N2 without need of setting such a radical ratio as 1:4 between the W/L values of the transistors T21 and T22.

With the subsequent discharge of the node N2, caused by the falling of the output signal $\phi 2$ (FIG. 4D), the node N3 is charged from the potential $V_L$ to the high potential. At this time, the potential on the node N1 is raised to the potential $V_P (V_P > V_{DD} + V_{TE})$ by the bootstrap circuit 32. In this way, the output signal $\phi d$ of the high potential $V_{DD}$ (FIG. 4E) can be obtained from the node N3. The node N1, however, is in the floating state while its potential is raised due to its capacitor coupling to the node N3. From this state (with the node N1 at the potential $V_P$, node N2 at the low potential and nodes N7 and N3 both at the high potential $V_{DD}$), the initial state is recovered with the returning of the node N1 to the low potential state and the returning of the node N2 to the high potential state.

In this embodiment, not only the transistors T23 and T24 can be omitted, but also there is no need of setting such a radical ratio as 1:4 between the conductance values, i.e., W/L values, of the transistors T21 and T22. Thus, improved integration density can be obtained in addition to reduced feedthrough current.

The W/L value of the transistor T21 in this embodiment has to be slightly greater than the W/L value of the transistor T13 in the prior art circuit (FIG. 1) in order to obtain substantially the same rising speed of potential at the node N3 as that in the prior art circuit. Nevertheless, the feedthrough current can be held within a low range compared to that in the prior art circuit.

In any embodiment described above, the gate of the D-type transistors T25 and T26 is selectively connected to either node N3 or N4. This is done so for substantially the same effects as obtainable with substantially the same potential of the nodes N3 and N4 in view of the control of the gate of the transistors T25 and T26 can be obtained.

As has been described in the foregoing, a dynamic signal generation circuit is obtained which permits reduction of the feedthrough current to reduce power consumption and reduce effects on source voltage fluctuations.

While the above embodiments have been described under the assumption that the transistors T21 to T24 have the same threshold voltage of $V_{TE}$, this may not be necessarily so. Further, while the transistors used in the above embodiments have all been N-channel transistors, it is possible to replace these transistors with P-channel transistors. In this case, the potentials $V_{DD}$ and $V_{SS}$ are of course interchanged.

In general, various changes and modifications may be made without departing from the scope and spirit of the invention.

What is claimed is:

1. A dynamic signal generation circuit comprising:
   a semiconductor circuit for receiving two input clock signals $\phi$ and $\bar{\phi}$ out of phase with each other and providing a first output signal $\phi 1$, said first output signal $\phi 1$ rising in synchronism to the leading edge of said input clock signal $\phi$, assuming a floating state after the lapse of a predetermined period of time and falling in synchronism to the trailing edge of said input clock signal $\phi$, and a second output signal $\phi 2$, said second output signal $\phi 2$ falling in synchronism to the occurrence of the floating state of said input signal $\phi 1$ and rising in synchronism to the trailing edge of said input clock signal $\phi$;
   first and second power supply terminals;
   a first transistor circuit including first and second enhancement type transistors cascode connected between said first and second power supply terminals, said first output signal $\phi 1$ from said semiconductor circuit being impressed upon the gate of said first enhancement type transistors, said second output signal $\phi 2$ from said semiconductor circuit being impressed upon the gate of said second enhancement type transistor;
   a capacitor circuit connected between the gate of said first transistor and the node between said first and second transistors;
   a second transistor circuit including third and fourth enhancement type transistors cascode connected between said first and said second power supply terminals, said first output signal $\phi 1$ being impressed upon the gate of said third enhancement type transistor, said second output signal $\phi 2$ being impressed upon the gate of said fourth enhancement type transistor; and
   a first depletion type transistor connected in the current path of said second transistor circuit, the conduction channel of the first depletion type transistor extending along said current path of said second transistor circuit, and the gate of the first depletion type transistor being connected to a potential substantially the same as the potential on said node between said first and second enhancement type transistors.

2. The dynamic signal generation circuit according to claim 1, wherein the gate of said first depletion type transistor is connected to the node between said third and fourth enhancement type transistors.

3. The dynamic signal generation circuit according to claim 1, wherein the gate of said first depletion type transistor is connected to the node between said first and second enhancement type transistors.

4. The dynamic signal generation circuit according to claim 1, which further comprises a second depletion type transistor connected in the current path of said first transistor circuit, the conduction channel of the second depletion type transistor extending along said current path of said first transistor circuit, and having its gate connected to a potential substantially the same as the potential at said node between said first and second enhancement type transistors.

5. The dynamic signal generation circuit according to claim 4, wherein the gate of said first depletion type transistor is connected to the node between said third and fourth enhancement type transistors, and also the gate of said second depletion type transistor is connected to the node between said first and second enhancement type transistors.

6. The dynamic signal generation circuit according claim 4, wherein the gates of said first and second depletion type transistors are both connected to the node between said first and second enhancement type transistors.

7. The dynamic signal generation circuit according to claim 4, wherein the gates of said first and second depletion type transistors are both connected to the node between said third and fourth enhancement type transistors.

8. A dynamic signal generation circuit comprising: a semiconductor circuit for receiving two input clock signals $\phi$ and $\bar{\phi}$ out of phase with each other and providing a first output signal $\phi 1$, said first output signal $\phi 1$ rising in synchronism to the leading edge of said input clock signal $\phi$, assuming a floating state after the lapse of a predetermined period of time and falling in synchronism to the trailing edge of said input clock signal $\phi$, and a second output signal $\phi 2$, said second output signal $\phi 2$ falling in synchronism to the occurrence of the floating state of said input signal $\phi 1$ and rising in synchronism to the trailing edge of said input clock signal $\phi$;
   first and second power supply terminals;
   a first transistor circuit including first and second enhancement type transistors cascode connected between said first and second power supply terminals, said first output signal $\phi 1$ from said semiconductor circuit being impressed upon the gate of said first enhancement type transistor, said second output signal $\phi 2$, from said semiconductor circuit being impressed upon the gate of said second enhancement type transistor;
   a capacitor circuit connected between the gate of said first transistor and the node between said first and second transistors; and
   a first depletion type transistor connected in the current path of said first transistor circuit, the conduction channel of the first depletion type transistor extending along said current path of said first transistor circuit, and the gate of the first depletion type transistor being connected to a potential substantially the same as the potential on said node between said first and second enhancement type transistors.

9. The dynamic signal generation circuit according to claim 8, wherein said first and second enhancement type transistors are cascode connected between said first depletion type transistor and said second power supply terminal.

* * * * *